United States Patent
Yang

(10) Patent No.: US 8,989,227 B1
(45) Date of Patent: Mar. 24, 2015

(54) VCSEL DRIVER MAINTAINING STEADY OPERATION FROM TEMPERATURE EFFECTS OF VCSEL DIODE USING AUTOMATIC BIAS CONTROL (ABC) AND AUTOMATIC MODULATION CONTROL (AMC) IN OPTICAL TRANSCEIVER

(71) Applicant: Electronics and Telecommunications Research Institute, Daejeon (KR)

(72) Inventor: Choong-Reol Yang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/319,567

(22) Filed: Jun. 30, 2014

(30) Foreign Application Priority Data

Nov. 12, 2013 (KR) ........................ 10-2013-0137078

(51) Int. Cl.
  *H01S 3/00* (2006.01)
  *H01S 5/068* (2006.01)
  *H01S 5/183* (2006.01)

(52) U.S. Cl.
  CPC ............. *H01S 5/06808* (2013.01); *H01S 5/183* (2013.01)
  USPC .................. 372/38.07; 372/38.02; 372/38.01; 372/29.015; 372/29.011

(58) Field of Classification Search
  USPC ................... 372/38.07, 38.02, 38.01, 29.015, 372/29.011
  See application file for complete search history.

(56) References Cited

U.S. PATENT DOCUMENTS

| 6,198,497 | B1 * | 3/2001 | Luque ........................... 347/247 |
| 6,748,181 | B2 | 6/2004 | Miki et al. |
| 8,023,541 | B2 | 9/2011 | Nishimura et al. |
| 8,073,342 | B2 * | 12/2011 | Caplan ........................... 398/201 |
| 8,428,091 | B2 | 4/2013 | Park et al. |
| 2007/0286609 | A1 * | 12/2007 | Ikram et al. ................... 398/197 |

FOREIGN PATENT DOCUMENTS

| KR | 1020080102358 A | 11/2008 |
| KR | 1020120054517 A | 5/2012 |

OTHER PUBLICATIONS

S. K. Kang et al., A Novel Automatic Power Control Method for Multichannel VCSEL Driver, pp. 836-838.
Day-Uei Li et al., 10Gb/s 0.13μm CMOS laser drivers with extinction ratio control using thermistors, IEEE, 2007, pp. 260-263.

* cited by examiner

*Primary Examiner* — Kinam Park
(74) *Attorney, Agent, or Firm* — William Park & Associates Patent Ltd.

(57) ABSTRACT

In a VCSEL driver for automatic bias control and automatic modulation control, the VCSEL driver includes: a feedback module configured to receive an output of a VCSEL to provide a bias signal through a feedback loop; an automatic bias control block configured to adjust a bias current by switching on or off a plurality of power sources, which are connected in parallel with each other; an automatic modulation control block configured to connect in parallel a plurality of bias transistors that are connected to each of the plurality of power sources, and to adjust modulation current by switching each of the plurality of bias transistors on or off; and a main driver configured to provide the VCSEL with a drive current including the bias current and the modulation current, which are adjusted by control of each of the control blocks.

15 Claims, 5 Drawing Sheets

VCSEL DRIVER MAINTAINING STEADY OPERATION FROM TEMPERATURE EFFECTS OF VCSEL DIODE USING AUTOMATIC BIAS CONTROL (ABC) AND AUTOMATIC MODULATION CONTROL (AMC) IN OPTICAL TRANSCEIVER

CROSS-REFERENCE TO RELATED APPLICATION(S)

This application claims priority from Korean Patent Application No. 10-2013-0137078, filed on Nov. 12, 2013, in the Korean Intellectual Property Office, the entire disclosure of which is incorporated herein by reference for all purposes.

BACKGROUND

1. Field

The following description relates generally to a vertical-cavity surface emitting laser (hereinafter referred to as VCSEL) driver of a high-speed optical communication system, and more particularly to a VCSEL driver that electrically drives a VCSEL, which is a laser diode for short-haul single mode optical link, or high-density optical link used at a transmitting end of an optical transceiver.

2. Description of the Related Art

An optical transceiver includes an optical transmitter and an optical receiver. A laser diode (LD) is a main optical element of an optical transmitter, and a photo diode is a main optical element of an optical receiver. Recently, a VCSEL diode is used as an optical transmitter in an optical transceiver. However, there are problems in that the VCSEL diode or a light emitting diode is highly temperature-dependent, threshold current is increased as temperatures rise, and current-light conversion efficiency is reduced. That is, when it is required to output a constant current from a drive circuit, optical output power after conversion is changed depending on temperature, and particularly under a high temperature condition, optical output power is reduced. Further, as light does not emit under the condition of a current below a threshold current, duty factor is degraded if a bias current (L level of an output current) is below the threshold current of the laser diode.

Accordingly, various methods have been used to stabilize communication characteristics by output of constant optical output power, including a method of feed-forward control in which temperature is determined using a thermistor, etc. so that an electric current value is dependent on a predetermined temperature, or a method of feedback control in which output of a laser diode is monitored with a monitoring photo diode (MPD) so that a constant electric current flows into the MPD.

More recently, optical transmission is conducted using a vertical-cavity surface emitting laser (VCSEL), instead of a laser diode. The VCSEL is an optical element, which is highly reliable with high speed operation and large-scale array arrangement, thereby enabling mass production and cost reduction.

Characteristics of the VCSEL are changed according to time and temperatures. For example, with respect to time, the VCSEL operates in such a peculiar manner that output power is gradually reduced until a certain threshold temperature, but beyond a certain threshold temperature, optical output power is gradually increased. A luminous element, such as LD and LED, may be temperature-compensated, but in a case a VCSEL is used as a luminous element, temperature characteristics unique to the VCSEL are difficult to be compensated. In optical transmission, temperature compensation is required in a wide temperature range of 0° C. to 85° C., and all temperature characteristics of the VCSEL are required to be compensated.

SUMMARY

According to an exemplary embodiment, a VCSEL driver is provided to electrically compensate for temperature effects and aging of a VCSEL by using a feedback loop. More specifically, a VCSEL driver including an automatic bias control (ABC) and an automatic modulation control (AMC) is provided, which controls a bias current (IBIAS) and a modulation current (IMOD) in a safe manner to provide very high current resolution to an optical transmitter.

In one general aspect, there is provided a VCSEL driver, which includes: a feedback module configured to receive an output of a VCSEL to provide a bias signal through a feedback loop; an automatic bias control block configured to adjust a bias current by switching on or off a plurality of power sources, which are connected in parallel with each other; an automatic modulation control block configured to connect in parallel a plurality of bias transistors that are connected to each of the plurality of power sources, and to adjust modulation current by switching each of the plurality of bias transistors on or off; and a main driver configured to provide the VCSEL with a drive current including the bias current and the modulation current, which are adjusted by control of each of the control blocks.

Figure 1:
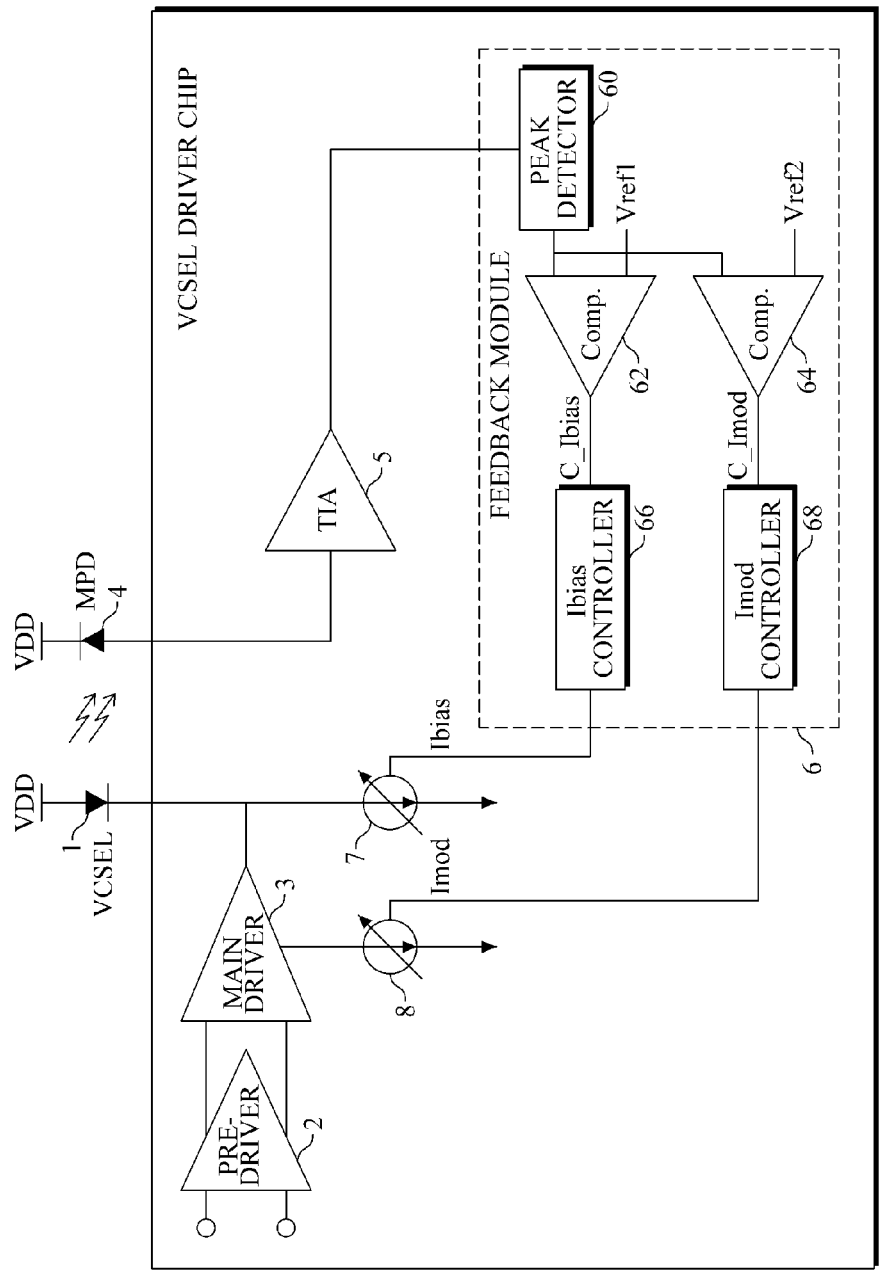
FIG. 1 is a block diagram illustrating an example of a laser driver according to an exemplary embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, an apparatus and method for controlling water quality sensor faults will be described in detail with reference to the accompanying drawings. The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a block diagram illustrating an example of a laser driver according to an exemplary embodiment.

Referring to FIG. 1, the following disclosure relates to a laser driver for providing a luminous element at an optical transmitting end of a VCSEL driver with sufficient drive current, which includes both a modulation current signal (Imod) and a bias current signal (Ibias). The luminous element is a vertical-cavity surface emitting laser (VCSEL) 1, which is a laser driver for short-haul single mode optical link, or high-density optical link, and the laser driver may be a VCSEL driver. The following disclosure will be described with an assumption that the laser driver is a VCSEL driver, but is not limited thereto.

In order to efficiently provide the VCSEL 1 with a stable bandwidth and high gain, the VCSEL driver according to an exemplary embodiment is formed in a multi-channel gigabit optical transmitter where gigabit frequency band is received, and a single channel is integrated in parallel. To this end, the VCSEL driver may be a VCSEL driver array that receives a multi-channel and gigabit frequency band. For example, the VCSEL may be a four-channel 2.5 Gpbs VCSEL, and the VCSEL driver may be a four-channel 2.5 Gpbs VCSEL driver.

According to an exemplary embodiment, optical elements constituting the VCSEL driver are integrated in a CMOS structure. The CMOS structure consumes significantly less energy, such that power consumption is reduced continuously, and as a result, energy efficiency is high for high-speed signal processing or calculation. The optical elements constituting the VCSEL driver may be integrated into an on-chip module with the CMOS structure. In order to reduce costs, which is an obstacle to commercialization of WDM-passive optical network (WDM-PON), the VCSEL driver according to an exemplary embodiment employs the CMOS photonics technology to make optical elements in a single chip, such that optical elements may be miniaturized, enabling low cost and low power consumption, and thereby reducing production costs.

According to an exemplary embodiment, the VCSEL driver includes a switch block for controlling a bias to control the reference current value, and an Ibias block and an Imod block each with four switches. The VCSEL driver supplies enough current to drive the VCSEL 1, in which a modulation current (Imod) and a bias current (Ibias) are generated and combined to be supplied to the VCSEL 1. To this end, the VCSEL driver integrates two bias signals output from a differential amplifier, and at the same time, increases an output resistance value to obtain a high voltage gain.

According to an exemplary embodiment, the VCSEL driver has a multi-stage cascode structure, in which transistors constituting the VCSEL driver are connected in series. In the multi-stage cascode structure, as no current flows into the gates, a high output resistance may be obtained, which increases the frequency characteristic, and guarantees a flexible output swing of the driver.

Hereinafter, operations of the VCSEL driver will be described in detail with reference to FIG. 1.

Referring to FIG. 1, the VCSEL driver includes a pre-driver 2, a main driver 3, and a feedback module 6.

The pre-driver 2 is formed on a front end of the main driver 3 to switch drive current supplied to the VCSEL 1. According to an exemplary embodiment, the pre-driver 2 includes an active feedback (AFB) circuit, and a negative impedance compensation (NIC) circuit. The AFB circuit is formed between two common-source amplifiers, such that at least a fraction of the output is returned to the input using negative transconductance feedback, thereby improving gain-bandwidth performance of the amplifiers. The NIC circuit compensates parasitic capacitance between two common-source amplifiers.

The main driver 3 supplies drive current to the VCSEL 1, in which the drive current to be supplied varies depending on input signals, and an input signal may be a differential signal. The main driver 3 controls an average value of the drive current according to a bias signal provided by the feedback module 6, in which the bias signal may be controlled according to temperature.

The main driver 3 receives input of differential signal, and output is connected to the VCSEL 1 through resistance. The main driver 3 controls a modulation signal (Imod) through the feedback module 6 according to temperature, and adjusts a swing of the drive current according to output of the modulation signal.

The feedback module 6 produces a bias control signal and a modulation control signal, and provides the produced bias control signal and modulation control signal to the main driver 3 through a feedback loop. Input of the feedback module 6 is connected to the VCSEL 1. The feedback module 6 provides the main driver 3 with a bias signal according to drive current passing through the VCSEL 1.

According to an exemplary embodiment, the feedback module 6 includes a peak detector 60, a bias current comparator 62, a modulation current comparator 64, a bias controller 66, and a modulation controller 68.

Specifically, the peak detector (PD) 60 extracts, through the VCSEL 1, a peak value from a signal output from a trans-impedance amplifier (hereinafter referred to as TIA) 5. In this case, the TIA 5 is not on a receiving side but on a transmitting side to be used to measure an output size of the VCSEL 1. Accordingly, if an output size of the VCSEL 1 is not measured, the TIA 5 may not be used.

The bias current comparator 62 compares a peak value extracted by the peak detector 60 with a first reference signal (Vref1) to output a bias current control signal (C_Ibias). The first reference signal (Vref1) may be changed depending on temperatures. The modulation current comparator 64 compares a peak value extracted by the peak detector 60 with a second reference signal (Vref2) to output a modulation current control signal (C_Imod). The second reference signal (Vref2) may be changed depending on temperatures. The first reference signal (Vref1) and the second reference signal (Vref2) may be predetermined values. Further, in order to control the current variation in a more detailed manner, the gap between the Vrefs may be narrowed.

The bias controller 66 adjusts a bias current according to a bias current control signal (C_Ibias) output from the bias current comparator 62, and outputs the adjusted bias current (Ibias). The modulation controller 68 is configured to adjust modulation current according to a modulation current control signal (C_Imod) output from the modulation current comparator 64, and to output the adjusted modulation current (Imod).

According to an exemplary embodiment, in order to be applied to wavelength division multiplexing (WDM), wavelengths of the bias current control signal and the modulation current control signal may be changed to a resolution in a frequency band of −3 dB according to wavelength spacing and wavelength changes depending on temperatures. For adjusting a bias current, flowing electric current is adjusted using several PMOS transistor paths, and modulation current may be adjusted to change transistor bias.

A bias current source 7 supplies bias current (Ibias), which is adjusted by a bias current control signal, to the main driver 3. A modulation current source 8 supplies modulation current (Imod), which is adjusted by a modulation current control signal, to the main driver 3.

As described above, after the peak detector 60 extracts the peak from a signal received from the VCSEL 1, the feedback module 6 compares the peak with each of the reference signals (Vref1, Vref2), and provides the main driver 3 with the bias current control signal (C_Ibias) and the modulation current control signal (C_Imod) through a feedback path. That is, optical characteristics of the VCSEL 1, which are changed depending on time and temperatures, are compensated so that a flat output is provided to the TIA 5. The TIA 5 functions as a simple receiver to identify operations of the VCSEL driver through a feedback loop. Ultimately, the VCSEL 1 and the VCSEL driver, which are transmitters with an array structure in which a single channel is integrated in multiple parallels to provide multi channels, may be provided to transmit a signal clearly without crosstalk.

Figure 2:
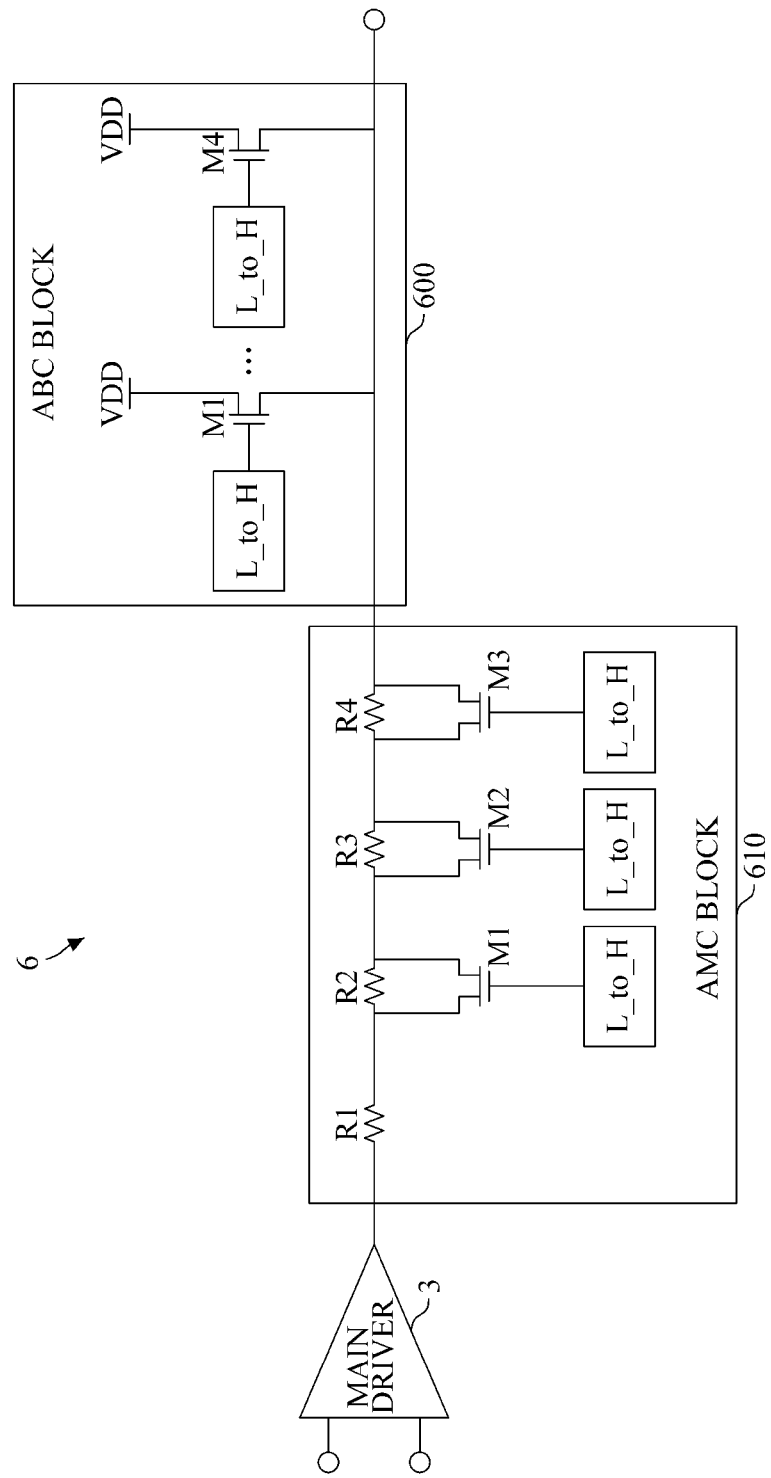
FIG. 2 is a block diagram illustrating an example of an automatic bias control (ABC) block and an automatic modulation control (AMC) block that are required for the main driver 3 in FIG. 1 according to an exemplary embodiment.

FIG. 2 is a block diagram illustrating an example of an automatic bias control (ABC) block 600 and an automatic modulation control (AMC) block 610 that are required for the main driver 3 in FIG. 1 according to an exemplary embodiment.

According to an exemplary embodiment, for adjusting a bias current, current flowing through several PMOS paths is set to be adjusted, and for adjusting modulation current, a transistor bias is set to be variable. That is, after four or five PMOS transistors are arranged in parallel, bias current is adjusted by switching each of the PMOS transistors on or off, and after four or five bias transistors to which each bias voltage (Vb) is input are arranged in parallel, modulation current is adjusted by switching each of the bias transistors on or off. The control signals for adjusting these currents are transmitted within a desired range through a feedback loop.

Specifically, referring to FIGS. 1 and 2, the ABC block 600 and the AMC block 610 may adjust bias current and modulation current by a method of switching a plurality of bias transistors on or off.

According to an exemplary embodiment, the ABC block 600 and the AMC block 610 adjust bias current in such a manner that four or five PMOS bias transistors are arranged in parallel, and then each of the PMOS bias transistors is selectively switched on or off according to sizes (R1, R2, R3, R4) of an signal output at the end of the main driver 3.

According to an exemplary embodiment, the ABC block 600 and the AMC block 610 adjust modulation current in such a manner that four or five PMOS bias transistors, to which bias voltage (Vb) is input, are arranged in parallel, and each of the PMOS bias transistors is selectively switched on or off. In this case, each bias voltage (Vb) is applied so that a corresponding PMOS bias transistor is operated in a saturation area. A bias current control signal (C_Ibias) and a modulation current control signal (C_Imod) of the ABC block 600 and the AMC block 610 are transmitted through a feedback circuit. In order to be applied to the Wavelength Division Multiplexing (WDM), a corresponding control signal may be adjusted so that a wavelength thereof is variable to a resolution of −3 dB band based on a wavelength change according to temperature and wavelength spacing.

An L_TO_H circuit constituting the ABC block 600 and the AMC block 610 is a circuit that changes a logic level (logic High/Low). That is, the L_TO_H circuit specifies High and Low logic operations of a modulation signal and a bias signal.

According to an exemplary embodiment, the ABC block 600 and the AMC block 610 have similar functions, but in a case where the ABC block 600 and the AMC block 610 operate with reference voltage (Vref) controlled differently, an operation section of the ABC block 600 and that of the AMC block 610 may be controlled to be different from each other. For example, in variable current section A of the VCSEL, the ABC block 600 may be activated, and in variable current section B, the AMC block 610 may be activated, for the purpose of transmitting an appropriate signal for each of the ABC block 600 and the AMC block 610.

Taking for example a case in which temperature dependency of the VCSEL 1 is compensated by using the ABC block 600 and the AMC block 610 mentioned above, when the temperature of the VCSEL 1 increases, an operating point of the VCSEL moves based on bias control, and a flattening function of the optical power is implemented. In this architecture, once the reference voltages to be input to the ABC block 600 and the AMC block 610 are determined, the initial bias and modulation currents are automatically set for stable optical output of the VCSEL. For the given reference voltages, as temperature increases, the lower MPD 4 current is fed into the TIA 5 due to the decreased optical output of the VCSEL 1. Then, the increased bias and modulation currents decrease the output voltage level of the peak detector 60. Accordingly, the proposed architecture may provide stable temperature compensation over a wide range of temperatures.

Figure 3:
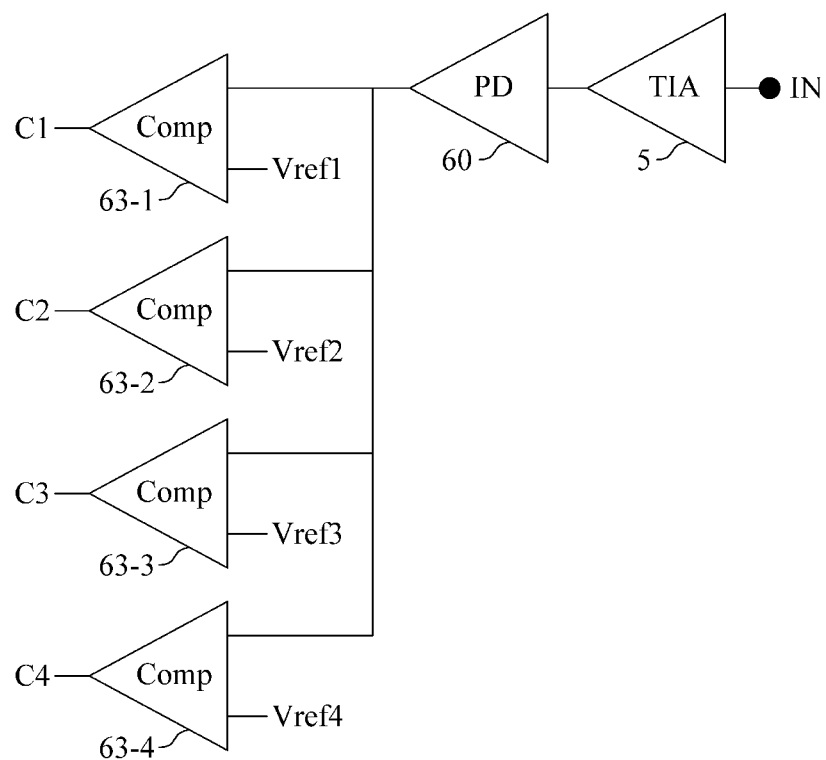
FIG. 3 is a block diagram illustrating an example method of generating control signals according to an exemplary embodiment.
Figure 4:
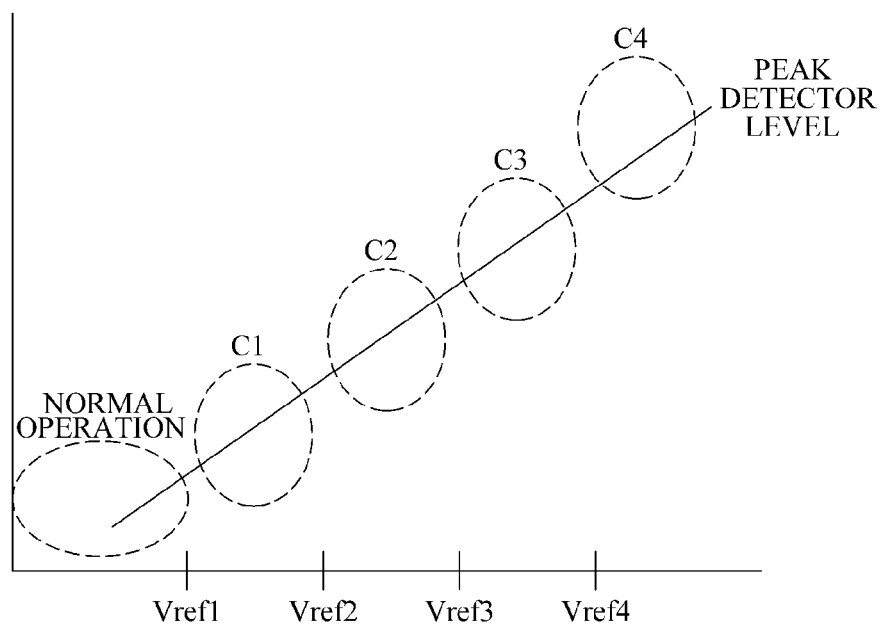
FIG. 4 is a graph illustrating an example method of determining control signals according to an exemplary embodiment.

FIG. 3 is a block diagram illustrating an example method of generating control signals according to an exemplary embodiment, and FIG. 4 is a graph illustrating an example method of determining control signals according to an exemplary embodiment.

Referring to FIGS. 1, 3, and 4, after the TIA 5 receives an output signal of the VCSEL 1, the peak detector 60 detects the peak of the received output signal. Then, as illustrated in FIG. 4, each comparator 63-1, 63-2, 63-3, 63-4 compares the peak detected by the peak detector 60 with each of reference voltages Vref1, Vref2, Vref3, Vref4 to produce control signals C1, C2, C3, C4.

Figure 5:
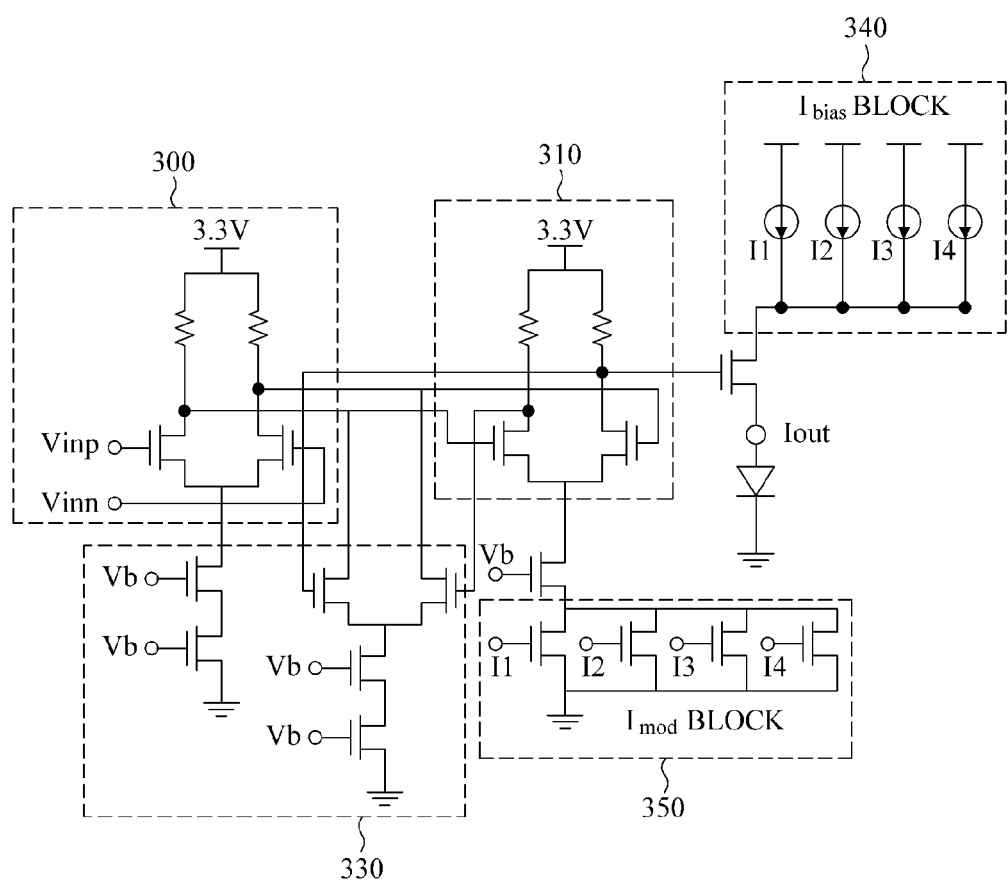
FIG. 5 is a detailed circuit diagram illustrating an example of the ABC block and the AMC block illustrated in FIG. 2.

FIG. 5 is a detailed circuit diagram illustrating an example of the ABC block and the AMC block illustrated in FIG. 2.

Referring to FIGS. 2 and 5, the ABC block 600 and the AMC block 610 include an active feedback (hereinafter referred to as AFB) circuit 330, and a bias current control block (hereinafter referred to as Ibias block) 340 and a modulation current control block (hereinafter referred to as Imod block) 350 with four switches each.

The AFB circuit 330, which is positioned between a first common source amplifier 300 and a second common source amplifier 310, returns a fraction of the output of the second common source amplifier 310 to the input of the second common source amplifier 310 using negative trans-conductance feedback, and enhances the total bandwidth of the amplifiers, as there is no load on a trans-impedance stage. The AFB circuit 330 places a transistor on a feedback path instead of generally used resistor, so as to adjust trans-conductance (gm) of the transistor, and to change a feedback factor. With such circuit, overload may be improved by expanding the bandwidth, and by lowering gain through gain variation for a big signal in a previous stage and a subsequent stage.

However, intermediate node between the first common source amplifier 300 and the second common source amplifier 310 is capacitive. Accordingly, in order to compensate such parasitic capacitance, the AFB circuit 330 may include a negative impedance compensation (NIC) circuit.

The Ibias block 340 varies $I_{bias}$. The Ibias block 340 may include four power sources connected in parallel, as illustrated in FIG. 5, in which bias current may be varied by selectively switching the four power sources on or off. FIG. 5 illustrates an example of four power sources, but the number of power sources is not limited thereto.

The Imod block 350 varies $I_{mod}$. The Imod block 350 may include transistors that receive input of currents I1, I2, I3, I4 of the power sources through the gates, as illustrated in FIG. 5, in which modulation current may be varied by selectively switching four currents I1, I2, I3, I4 on or off. FIG. 5 illustrates an example of four currents and transistors, but the number of currents and transistors is not limited thereto.

As illustrated in FIG. 5, the Ibias block 340 and the Imod block 350 may be separated so that variable bias current and variable modulation current may not affect each other. In this case, the Ibias block 340 operates in a first variable current section of the VCSEL 1, and the Imod block 350 operates in a second variable current section of the VCSEL 1.

According to an exemplary embodiment, even when using a luminous element, such as VCSEL, which has unique temperature characteristics at both high and low temperatures, temperature characteristics of a luminous element may be compensated in a whole temperature range, and as a result, an optical communication system may be established to have consistently stable optical output power.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims. Further, the above-described examples are for illustrative explanation of the present invention, and thus, the present invention is not limited thereto.

What is claimed is:

1. A vertical-cavity surface emitting laser (VCSEL) driver, comprising:
    a feedback module configured to receive an output of a VCSEL to provide a bias signal through a feedback loop;
    an automatic bias control block configured to adjust a bias current by switching on or off a plurality of power sources, which are connected in parallel with each other;
    an automatic modulation control block configured to connect in parallel a plurality of bias transistors that are connected to each of the plurality of power sources, and to adjust modulation current by switching each of the plurality of bias transistors on or off; and
    a main driver configured to provide the VCSEL with a drive current including the bias current and the modulation current, which are adjusted by control of each of the control blocks.

2. The VCSEL driver of claim 1, wherein the automatic bias control block is configured to connect the plurality of power sources in parallel with each other, and to vary the bias current by selectively switching each of the plurality of power sources on or off.

3. The VCSEL driver of claim 1, wherein the automatic modulation control block is configured to connect in parallel the plurality of bias transistors that receive currents of each of the plurality of power sources of the automatic bias control block through gates, and to vary the modulation current by selectively switching each of the plurality of bias transistors.

4. The VCSEL driver of claim 1, wherein each of the bias transistors constituting the automatic modulation control block is a PMOS bias transistor.

5. The VCSEL driver of claim 1, wherein an operating section of the automatic modulation control block is separated from an operating section of the automatic bias control block.

6. The VCSEL driver of claim 5, wherein the automatic modulation control block operates in a first variable current section of the VCSEL, and the automatic bias control block operates in a second variable current section of the VCSEL.

7. The VCSEL driver of claim 1, wherein the feedback module comprises:
    a peak detector configured to extract a peak from an output signal of the VCSEL;
    a bias current comparator configured to compare the peak extracted from the peak detector with a first reference signal to output a bias current control signal;
    a modulation current comparator configured to compare the peak extracted from the peak detector with a second reference signal to output a modulation current control signal;
    a bias controller configured to adjust bias current according to the bias current control signal output from the bias current comparator to output the adjusted bias current; and
    a modulation controller configured to adjust modulation current according to the modulation current control signal output from the modulation current comparator to output the adjusted modulation current.

8. The VCSEL driver of claim 7, wherein in order to be applied to wavelength division multiplexing, the bias current control signal and the modulation current control signal has a wavelength, which is varied to a resolution of −3 dB frequency band depending on wavelength spacing and wavelength changes according to temperatures.

9. The VCSEL driver of claim 7, wherein the first reference signal and the second reference signal are determined according to temperatures, and the two reference signals are predetermined.

10. The VCSEL driver of claim 1, wherein the main driver provides the VCSEL with a summation of the adjusted bias current and the adjusted modulation current.

11. The VCSEL driver of claim 1, further comprising:
    an active feedback circuit configured to be formed between a first common source amplifier and a second common source amplifier to return at least a fraction of the output of the second common source amplifier to the input of the second common source amplifier through negative trans-conductance feedback, so as to adjust bandwidth and gain.

12. The VCSEL driver of claim 11, wherein the active feedback circuit is configured to comprise a negative impedance compensation circuit to compensate parasitic capacitance between the first common source amplifier and the second common source amplifier.

13. The VCSEL driver of claim 1, further comprising a trans-impedance amplifier (TIA) configured to measure an output size of the VCSEL, and to transmit the measured output size of the VCSEL to the feedback circuit.

14. The VCSEL driver of claim 1, further comprising a pre-driver configured to be formed in a front end of the main driver to switch driver current provided to the VCSEL.

15. The VCSEL driver of claim 14, wherein the pre-driver comprises:
    an active feedback circuit configured to return at least part of output to input through a negative trans-conductance feedback; and a negative impedance compensation circuit configured to compensate parasitic capacitance.

\* \* \* \* \*